United States Patent [19]
Tamir et al.

[11] 3,970,897
[45] July 20, 1976

[54] DETECTOR AND APPARATUS INCORPORATING THE SAME FOR DETECTING PHASE-ASYMMETRY AND PROTECTING THREE-PHASE MOTORS AGAINST DANGEROUS OPERATING CONDITIONS

[75] Inventors: David Tamir, Jerusalem; Michael S. Erlicki, Haifa, both of Israel

[73] Assignee: Technion Research and Development Foundation Ltd., Haifa, Israel

[22] Filed: Apr. 22, 1974

[21] Appl. No.: 463,199

[30] Foreign Application Priority Data
Apr. 30, 1973  Israel.................................... 42142

[52] U.S. Cl. .......................... 317/13 R; 317/27 R; 317/47; 317/53
[51] Int. Cl.$^2$ ........................................ H02H 7/08
[58] Field of Search................. 317/27, 14 R, 14 D, 317/47, 48, 53, 19, 13 R, 13 A; 324/77 E, 78 J, 82; 340/253 Y

[56] References Cited
UNITED STATES PATENTS

| | | | |
|---|---|---|---|
| 3,144,590 | 8/1964 | Sharp et al........................ | 317/14 D |
| 3,223,889 | 12/1965 | Schweitzer, Jr.................. | 317/27 R |
| 3,337,772 | 8/1967 | Anderson.......................... | 317/27 R |
| 3,515,943 | 6/1970 | Warrington........................ | 317/53 |
| 3,579,040 | 5/1971 | Tenenbaum...................... | 317/14 D |
| 3,832,600 | 8/1974 | Specht.............................. | 317/14 D |

FOREIGN PATENTS OR APPLICATIONS

| | | | |
|---|---|---|---|
| 26,240 | 10/1971 | Israel................................ | 317/13 R |

*Primary Examiner*—J D Miller
*Assistant Examiner*—Patrick R. Salce
*Attorney, Agent, or Firm*—Donald M. Sandler

[57] ABSTRACT

A detector for detecting phase-asymmetry in connection with a three-phase rotary machine includes a sensor couplable to the machine for picking up a signal associated with the leakage field during rotation of the machine. Circuit means are also provided for amplifying characteristic components of the signal (i.e., components whose amplitudes greatly increase relative to other components when phase-asymmetry occurs) and for attenuating other components of the signal, particularly at frequencies around $f$ and $3f$ where $f$ is the line frequency. Converter means converts the output of the circuit means into a control voltage, and control means are responsive to increases in the control voltage above a predetermined level established in the absence of phase-asymmetry for producing an output signal indicative of phase-asymmetry.

14 Claims, 2 Drawing Figures

DETECTOR AND APPARATUS INCORPORATING THE SAME FOR DETECTING PHASE-ASYMMETRY AND PROTECTING THREE-PHASE MOTORS AGAINST DANGEROUS OPERATING CONDITIONS

This invention relates to a detector of phase-asymmetry, and to apparatus for protecting three-phase rotary machines against phase-asymmetry and other dangerous operating conditions.

The term "phase-asymmetry" means asymmetric or unbalanced conditions in the supply voltages to a three-phase rotary machine such as a motor. The supply voltage is said to be unbalanced when there is a substantial difference between any one of the three phases of the supply and the other two phases. The dropping out of one phase in the power supply to a machine, or the development of an internal short circuit in one set of its windings, are common types of phase-asymmetry. Sustained operation of a three-phase machine in the presence of phase-asymmetry, which may also exist on start up, results in greater than working current flow through the windings of the machine, such flow manifesting itself by substantial increases in the operating temperature of the machine. The significance of sustained operation of an over-heated machine is demonstrated by motor insulation tests (AIEE Specification 510, IEEE Specification 117) which show that a 10% increase in insulation temperature over the design temperature reduces insulation life by 50%. Therefore, it is critical to detect, on an incipient basis, any operating condition such as phase-asymmetry or machine overloading that will result in overheating, so that corrective action can be taken before significant damage occurs.

A conventional approach to machine protection, involving monitoring the temperature with sensors placed inside the slots close to the coils in large machines, or inside the housings in small machines, suffers from the obvious deficiency of discovering the existence of dangerous operating conditions only after some degree of damage has occurred. Phase-asymmetry can be detected, however, in some sizes and classes of rotating machines, using the approach disclosed in Israel Pat. No. 26240, which was laid open to public inspection on Oct. 20, 1971. such approach is based on the discovery that phase-asymmetry is accompanied by a substantial increase in the amplitude of certain harmonic components of the leakage field relative to other components thereof, such increase being detectable by a sensor coupled to the machine. The frequency of the components whose amplitudes greatly increase when phase-asymmetry occurs are in the neighborhood of $2f$ where $f$ is the line frequency. The detector of the prior art operates by passing the sensor signal through a filter, such as a twintee filter, designed to pass frequencies in the neighborhood of $2f$. According to the patent, a significant increase in the level of the output of the filter should accompany the occurrence of phase-asymmetry.

There are two reasons why the prior art approach is not always successful in responding to phase-asymmetry; (1) attenuated components at $f$ and $3f$ passed by the filter, which is not perfect, can be so strong as to mask the presence of components in the neighborhood of $2f$ even after the latter are considerably strengthened due to phase-asymmetry; and (2) even if the attenuated components do not mask the strengthened components in the neighborhood of $2f$ when phase-asymmetry occurs, the latter components may be of insufficient strength to drive an indicator. For these reasons, detectors based on the prior art have not proved to be practical over a wide range of sizes and classes of three-phase rotary machines, with the result that comprehensive, reliable protection of such machines against dangerous operating conditions has, heretofore, not been available.

It is an object of the present invention, therefore, to provide a new and improved detector of phase-asymmetry which does not suffer from the deficiencies of the prior art, as well as to provide apparatus for protecting three-phase rotary machines against several different types of improper operating conditions such as start-up when less than all phases in the power supply are present, and operating in the presence of phase-asymmetry or overload.

According to the present invention, there is provided a detector for detecting phase-asymmetry in connection with a three-phase rotary machine comprising a sensor couplable to the machine for picking up a signal associated with the leakage field during rotation of the machine; circuit means including an active element for amplifying characteristic components of the signal (i.e., components whose amplitudes greatly increase relative to other components in the signal when phase-asymmetry occurs) and for attenuating other components of the signal, particularly at frequencies around $f$ and $3f$ where $f$ is the line frequency; converter means for converting the output of the circuit means into a control voltage; and control means responsive to increases in the control voltage above a predetermined level established in the absence of phase-asymmetry for producing an output signal indicative of phase-asymmetry.

Signal components of the leakage field whose amplitudes greatly increase when phase-asymmetry occurs are termed "characteristic signal components," and their frequencies lie in a band of frequencies (termed hereinafter the "band of characteristic frequencies") determined by the formula: $f(2-S)$ where $f$ is the line frequency and S is the slip of the motor, a quantity functionally dependent on the load. Because the slip increases with load monotonically in all practical machines from a value $So$, at no load, to a value $Sr$, at rated load, the signal frequency $f_s$ lies in the band of characteristic frequencies given by the expression:

1. $(2-Sr)f < f_s < (2-So)f$

For most 50 Hz machines, for example, the characteristic signal components $f_s$ have frequencies in the band $100 < f_s < 92$ Hz.

The active element of the circuit means thus has cut-off frequencies as follows:

2. Upper: $f(2-So)$
3. Lower: $f(2-Sr)$

The control voltage produced by the circuit means will depend, almost entirely, on the strength of the components in the sensor signal within these cut-off frequencies, and will thus be substantially independent of the strength of the balance of the components in the sensor signal.

When the machine is operated in a calibration mode (i.e., in the absence of phase-asymmetry), the resultant control voltage can be used to establish a reference to which the control voltage can be compared when the machine is in normal operation. The presence of noise in the sensor signal, and its load dependent modulation at a frequency of $f \times s$ require the reference to be greater than the control voltage obtained under calibration conditions, depending on the degree of sensitivity required. On this basis, any increase in the control voltage above the reference must arise solely from the occurrence of phase-asymmetry. Thus, a detector according to the present invention is capable of reliably detecting phase-asymmetry regardless of the size or class of machine, or the power supply parameters, while simultaneously suppressing false triggering due to noise.

In the preferred embodiment of the invention, the active element of the circuitry means is a bandpass active filter, the upper and lower cut-off frequencies of which are given by equations (2) and (3) respectively. Attenuation of the non-characteristic components of the sensor signal is achieved using passive filter means. Preferably the latter include a first band-rejection filter whose center frequency is $f$ and a second band-rejection filter whose center frequency is $3f$.

Preferably, the converter means is in the form of a peak detector, the control voltage output of which is applied to a primary comparator which produces an output signal when the control voltage exceeds a predetermined reference value. The output signal can be used to actuate an indicator thus providing notice that phase-asymmetry has occurred.

In order to prevent false actuation of the indicator due to large noise spikes in the sensor signal within the characteristic band of frequencies or due to a transient asymmetrical condition, actuation of the indicator may be delayed until the output signal of the primary comparator has persisted continuously for a predetermined period of time. Such period of time may be adjustable and may include the possibility of zero delay. Preferably, the indicator is actuated by a pulse produced by a delay generator responsive to the output signal from the primary comparator that persists for a predetermined period of time.

The indicator may be a visual or aural alarm, or a device for disconnecting power from the machine. When power disconnection is desired, the indicator may include a relay having a set of contacts for causing the power supply to be connected to the terminals of the machine when the relay is energized. In such case, first switch means is provided which, when operated, energizes the relay. Second switch means, shunting the relay, are also provided for de-energizing the relay when the second switch means is operated by the pulse from the delay generator. Preferably, the second switch means is a silicon-controlled-rectifier.

In order to preclude starting the machine when less than all phases of the power supply are present at the terminals of the machine, the first switch means can also be operated by an output signal derived from a threshold detector driven by an AC/DC converter that monitors the voltage in each line of the power supply. When less than rated line voltage appears at each terminal of the machine, the output of the AC/DC converters drops below the threshold level of the detector thus preventing the threshold detector from operating the first switch means. In the absence of any other means to operate the first switch means, the relay cannot be energized with the result the power supply cannot be connected to the machine and start-up is thus precluded.

When phase-asymmetry occurs during rotation of the machine, the DC voltage of the AC/DC converter may drop below the threshold level thus causing premature de-energization of the relay and disconnection of the machine from the power supply, before the delay generator has determined whether the phase-asymmetry is transient. Therefore, it is desirable for the first switch means to be operated by a switch operator circuit in response to an output signal from the primary comparator. In such case, a transient phase-asymmetry condition, normally causing de-energization of the relay by reason of the effect of the AC/DC converter, is responded to by the switch operator means so as to sustain energization of the relay. Should the condition be non-transient, the output pulse of the delay generator will operate the second switch means thus de-energizing the relay notwithstanding the sustained operation of the first switch means by the switch operator circuit. While it is presently preferred to provide for the relay to be energized until phase-asymmetry occurs, it is also possible for this situation to be reversed.

Finally, the invention also consists in apparatus using the above described detector for protecting a three-phase rotary machine against dangerous operating conditions such as overload as well as phase-asymmetry. Such apparatus comprises the detector, into which the relay has been incorporated and a current sensor in one line of the power supply to the machine, the output of the current sensor being converted to a voltage and applied to an overload comparator that produces a control voltage whose magnitude exceeds the reference value of the primary comparator the current flowing in the line exceeds some maximum value determined by the circumstances of the motor application. The control voltage of the overload comparator is applied to the input to the primary comparator so that an overload condition is responded to in the same way as phase-asymmmetry permitting a transient overload condition to occur without actuating the indicator. Since the apparatus provides protection against phase-asymmetry, monitoring of only one of the three lines supplying power to the machine is sufficient for detecting an overload condition.

Embodiments of the invention are illustrated by way of example and with reference to the accompanying drawings, wherein.

Figure 1:
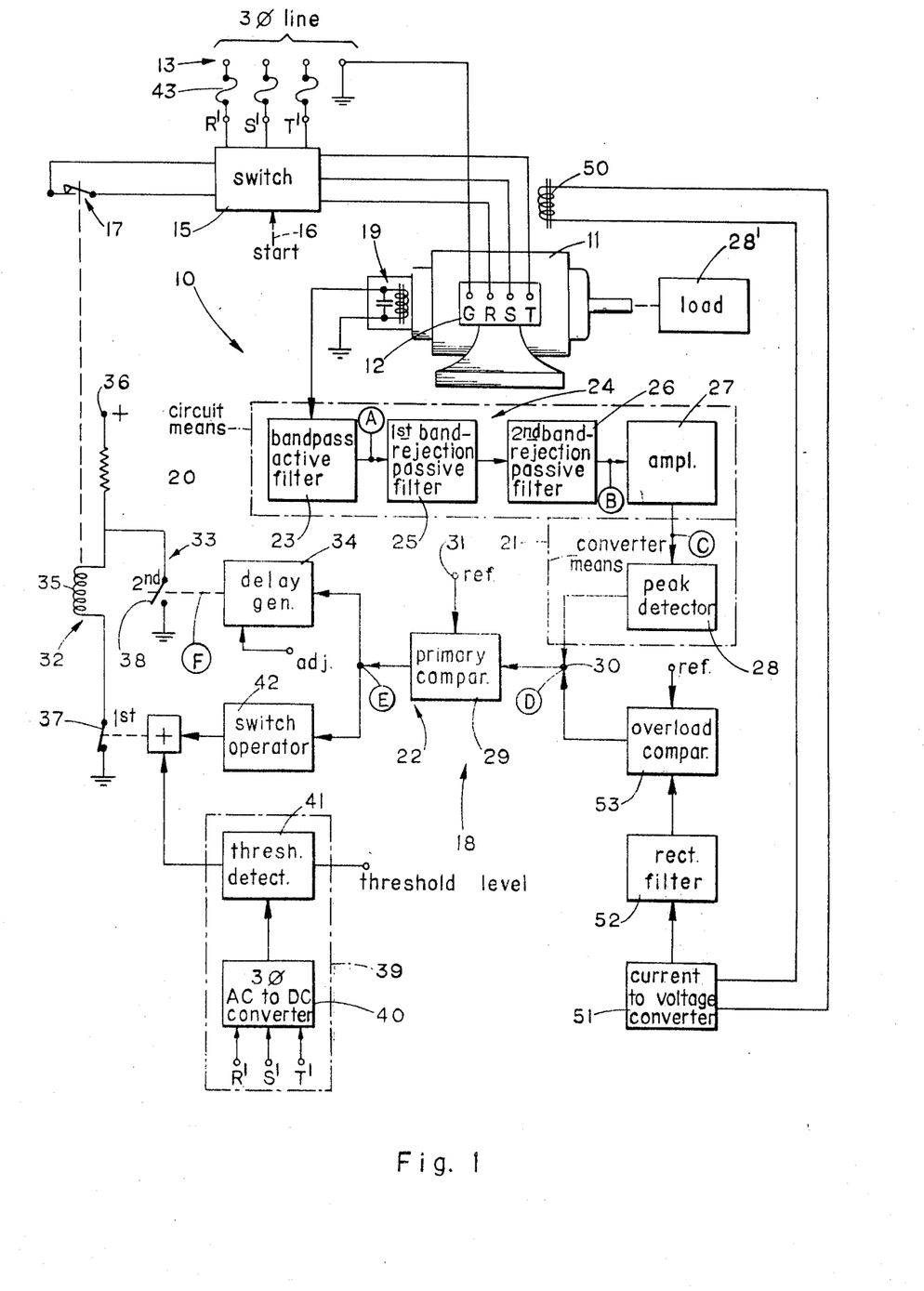
FIG. 1 is a block diagram of the detector according to the present invention incorporated into apparatus for protecting 3-phase machines against dangerous operating conditions.

Referring now to FIG. 1, reference numeral 10 designates a detector for detecting incipient phase-asymmetry in connection with a three-phase rotary machine shown in the form of motor 11 having a terminal box 12 attached thereto by which the three windings (not shown) of the motor are separately terminated in phase terminals R, S and T and the ground terminal G. Power from the line supply 13 is applied to the phase terminals by way of individual fuses connected to external terminals R', S' and T' of switch 15, and through the contactors of a starting coil (not shown) contained in the switch. The starting coil may be energized by actuation of the "start" input 16 provided relay contacts 17 are closed. The latter contacts are a part of the apparatus 18 into which apparatus 10 is incorporated for protecting motor 11 against dangerous operating conditions such as start-up when less than all phases are present, phase-asymmetry during rotation of the machine, and overload of the machine.

Detector 10 comprises sensor 19, circuit means 20, converter means 21, and control means 22. Sensor 19 comprises a coil containing a soft iron core and a capacitor shunting the coil. The capacitor and coil form a tank circuit which is resonant at about $2f$, where $f$ is the frequency of the line supply 13. The coil and capacitor are contained in an enclosure that is mechanically connected to the housing of the motor centrally along the axis of rotation as indicated in FIG. 1.

By reason of the coupling between the tank circuit formed by the coil and the capacitor, rotation of motor 11 will cause sensor 19 to develop a signal that can be used to detect incipient phase asymmetry as described above. Such signal is applied to circuit means 20 which include an active element for amplifying characteristic components of the signal in the frequency range defined by Equations (2) and (3), and for attenuating other components of the signal outside such frequency range, and particularly at frequencies around $f$ and $3f$. The output of circuit means 20 is converted into a control voltage by converter means 21. Finally, control means 22 is responsive to increases in the control voltage above a predetermined level (established in the absence of phase-asymmetry) for producing an output signal indicative of phase-asymmetry.

In the preferred embodiment of the invention, the active element of the circuit means 20 comprises a bandpass active filter 23 for amplifying the sensor signal. The upper and lower cut-off frequencies of the bandpass are defined by Equations (2) and (3) above and thus comprehend the characteristic band of frequencies of components whose amplitudes greatly increase relative to other components in the sensor signal when phase-asymmetry occurs. It should be noted that the upper and lower cut-off frequencies exclude the frequencies of $f$ and $3f$. Following the active element 23 are passive filter means 24 for attenuating the output of the bandpass active filter at frequencies thereof.

The passive filter means preferably includes a first bandpass rejection filter 25 whose upper and lower cut-off frequencies comprehend the frequency $f$ but exclude the characteristic band of frequencies, and a second band-rejection passive filter 26 whose upper and lower cut-off frequencies comprehend the frequency $3f$ but exclude the characteristic band up frequencies. Finally, the circuit means includes amplifier 27 which provides the output to the circuit means 20.

By reason of the components of circuit means 20, the output thereof will be substantially dependent only on the characteristic components of the sensor signal and be substantially independent of the other components of the sensor signals. particularly those components at frequencies around $f$ and $3f$. Except for transient conditions caused by noise in the system, the output of amplifier 27 will be a modulated AC signal, the average value of which will lie within a limited range determined by the operating conditions of motor 11 under load 28 in the absence of phase-asymmetry. The modulation of the output of amplifier 27 is at a relatively low frequency which is $f \times s$ so that the average value undulates at such frequency. The bandpass active filter 23 and the band-rejection passive filters 25 and 26 prevent attenuated components at $f$ and $3f$ from being strong enough to mask the presence of the characteristic components of the sensor signal regardless of the relative strength of these signals produced at the output of sensor 19. Furthermore, the presence of amplifier 27 ensures that the characteristic components of the signal that are present when phase-asymmetry occurs will be amplified sufficiently so as to reliably drive the control means 22 for the purpose of producing an output signal indicative of the occurrence of phase-asymmetry.

Converter means 21 is preferably in the form of a peak detector 28, which is conventional in nature, and is responsive to the output of amplifier 27 for producing a DC control voltage whose value is directly related to the peak value of the output of the circuit means 20. Thus, when motor 11 is operating under normal conditions, i.e., in the absence of phase-asymmetry, the control voltage produced by peak detector 28 will always be less than some predetermined value except for the presence of noise which is superimposed on the control voltage. When, however, phase-asymmetry occurs producing a substantial increase in the strength of the characteristic components of the sensor signal, the control voltage produced by the peak detector 28 will increase significantly. Such increase is responded to by control means 22 which includes a primary comparator 29 to whose input 30 is applied the DC control voltage of peak detector 28. The reference value 31 is set by a calibration process based on the operation of motor 11 in the absence of phase-asymmetry. When the control voltage at input 30 exceeds the reference value, primary comparator 29 produces an output signal.

The sensitivity of the detector is determined by the amount that the reference value is set above the value of the peak level of the modulated control voltage produced by detector 29 when the motor is operated in its calibration mode (i.e., in the absence of phase-asymmetry). Finally, the control means 22 includes an indicator 32, and actuating means 33 responsible to an output signal from the primary comparator 29 for actuating the indicator thus indicating that a dangerous operating condition exists.

In order to prevent false actuation of the indicator 32 due to large noise spikes in the sensor signal within the characteristic band of frequencies, or due to a transient phase-asymmetry condition, actuation of the indicator is delayed until the output signal of the primary comparator 29 has persisted for a predetermined period of time. Such period of time may be adjustable and may include the possibility of zero delay. In order to achieve this result, delay generator 34 is utilized. When the output from the primary comparator 29 persists for a predetermined period of time, the delay generator produces an output pulse, the indicator 32 being constructed and arranged to be actuated in response to such an output pulse from the delay generator.

Indicator 32 may be a visual or aural alarm or a device for disconnecting power from the motor as indicated in FIG. 1. Accordingly, indicator 32 may include a relay having a coil 35 that operates the set of contacts 17 for the purpose of causing the power supply 13 to be connected to the phase terminals of the motor 11 when current flows through the coil 35. Coil 35 is connected to a source of power 36 through a suitable impedance and through first switch means 37. When switch means 37 is operated (i.e., closed), current flows through coil 35 and indicator relay 32 is energized.

A second switching means 38 shunts the coil 35 of the relay. When the second switching means 38 is open, the first switch means 37 will control the energization of the relay. When the second switch means 38 is operated (i.e., closed) by the output pulse from generator 34, coil 38 of the relay is shunted and the relay is de-energized notwithstanding the continued operation of the first switch means 37.

The above described portion of the detector 10 is effective in shunting down motor 11 in the presence of a phase-asymmetry condition that persists for a period of time determined by the setting of the delay generator 34. Phase-asymmetry may also exist in the power supply 13 before motor 11 has been started. In such case, it is essential to preclude the starting of the motor and, to this end, the first switch means 37 can also be operated by a line monitoring circuit 39. This circuit includes a three-phase AC/DC converter connected to the R', S' and T' terminals and producing a DC voltage whose level is directly related to the instantaneous sum of the voltages in each line connected to such terminals. Circuit 39 also includes a threshold detector 41 which produces an output signal as long as the level of the DC voltage produced by the converter 40 exceeds a predetermined level. When rated voltage appears at each of the terminals R', S' and T', the output of the converter 40 will exceed the threshold level whereby the detector 41 will produce an output signal capable of operating (i.e., closing) switch means 37. When less than rated voltage appears at each terminal of the motor, there will be no output signal from detector 41. Switch means 37 is constructed and arranged so that it is operated only in the presence of an output signal from the detector 41 (except for the effect of switch operator circuit 42 which is described below).

The absence of an output signal from detector 41 will prevent the latter from operating the first switch means 37. In the absence of any other means to operate the first switch means, it will be open thus disconnecting the power supply 36 from the coil 35 of the relay. Thus, the relay will be de-energized and power from the line 13 cannot be applied to the motor by way of switch 15 if the "start" input 16 is actuated.

When rated line voltage is present at the terminals of the machine, however, detector 41 will produce an output signal that operates the first switch means 37 thus causing the set of contacts 17 to be closed. In this situation, actuation of the "start" input 16 will permit the power in line 13 to be applied to the terminals of the motor 11.

When phase-asymmetry occurs during rotation of the motor, the voltage at the output of converter 40 may or may not drop below the threshold level. The dropping out of a phase while the motor is operating due to failure of a fuse 43, for example, or due to a failure in the utility lines supplying power, causes the motor 11 to operate as a generator supplying voltage to the missing phase. Such voltage may or may not approach the rated phase voltage. As a consequenc, the occurrence of phase-asymmetry may cause an ambiguous condition to exist with respect to the operation of first switch means 37. If the output signal from converter 41 drops below the threshold level when phase-asymmetry occurs, premature de-energization of indicator 32 may result thereby disconnecting the motor from the power supply before the delay generator 34 has determined whether the phase-asymmetry is transient in nature. Therefore, switch operator circuit 42 is provided for the purpose of operating first switch means 37 in the presence of an output signal from the primary comparator 29 (i.e., during the occurrence of phase-asymmetry) independently of the effect that phase-asymmetry has on the operation of circuit 39. Thus, a transient phase-asymmetry condition normally causing the indicator 32 to be de-energized by reason of its effect on circuit 39 is responded to by the switch operator means 42 so as to sustain the energization of the relay. Should the condition persist, the delay generator will produce an output pulse that will operate the second switch means 38 thus de-energizing the relay, notwithstanding the sustained operation of the first switch means by circuit 39.

In utilizing the detector 10 for the purpose of protecting a three-phase motor against dangerous operating conditions such as phase-asymmetry in starting up or operating the motor, the latter is operated in its calibration mode by ensuring that rated line voltage is present at each of the terminals of the motor and that no phase-asymmetry is present. Under these conditions, an output signal will be present from detector 41 thus causing the operation of first switch means 37 and permitting the flow of current through coil 35 to cause the set of contacts 17 to be closed. The calibration mode is initiated by actuation of the "start" input 16 of the switch 15 which will thus be effective to provide rated line voltage to the terminals of the motor. By reason of knowledge of the slip characteristics of the motor with respect to the load thereon, the bandpass of active filter 23 will have been established, so that the control voltage produced by the peak detector 28 can be examined with a meter or other indicating device. The reference value associated with primary comparator 29 now can be selected manually at some level above the maximum control voltage produced by peak detector 28 depending upon the degree of sensitivity desired in controlling the motor 11. This completes the calibration mode of the motor operation.

After calibration of the motor has been completed, circuit 39 will preclude starting up the motor unless rated line voltage is present at the motor terminals. Once the motor has been started and is running, the occurrence of phase-asymmetry causes comparator 29 to produce an output signal persisting as long as the phase-asymmetry persists. Such output signal is effective to cause switch operator circuit 42 to maintain the operation of the first switch means independently of the effect of phase-asymmetry on circuit 39. The output signal also is applied to the delay generator 34 which will produce an output pulse when the phase-asymmetry persists for a predetermined period of time. The output pulse from the delay generator will cause the operation of second switch means 38 which will shunt the coil 35 of the relay thus de-energizing the same and causing the set of contacts 17 to open. The opening of these contacts will disconnect the power supply from the motor terminals and automatically shut down motor 11 before damage can occur.

The invention also consists in apparatus 18 that uses detector 10 for the purpose of protecting the motor against overload as well as phase-asymmetry on start-up during rotation. Apparatus 18 thus comprises detector circuit 10 in combination with an overload detector comprising a current sensor 50 associated with one phase of the power supply to the motor, a current-to-voltage converter 51 which converts the AC current to an AC voltage, a rectifier/filter 52 which converts AC voltage to a DC voltage whose level depends upon the magnitude of the current flowing in the monitored line, and an overload comparator 53.

The reference level of the overload comparator is established by the rated current flow under rated load conditions. When this rated current flow is exceeded, the DC voltage produced by rectifier/filter 52 will exceed the reference level of comparator 53 causing the latter to produce a control voltage which is applied to the input 30 of the primary comparator 29. Comparator 53 is arranged so that the level of the control voltage produced upon an overload situation exceeds the reference value of the primary comparator 29. In this way, comparator 29 responds to an overload condition in the same way as it responds to phase-asymmetry thus permitting a transient overload condition to occur without actuating the indicator. Because detector 10 is effective to provide protection against phase-asymmetry, the sensor 50 need be associated with but a single line of the supply to the motor.

Figure 2:
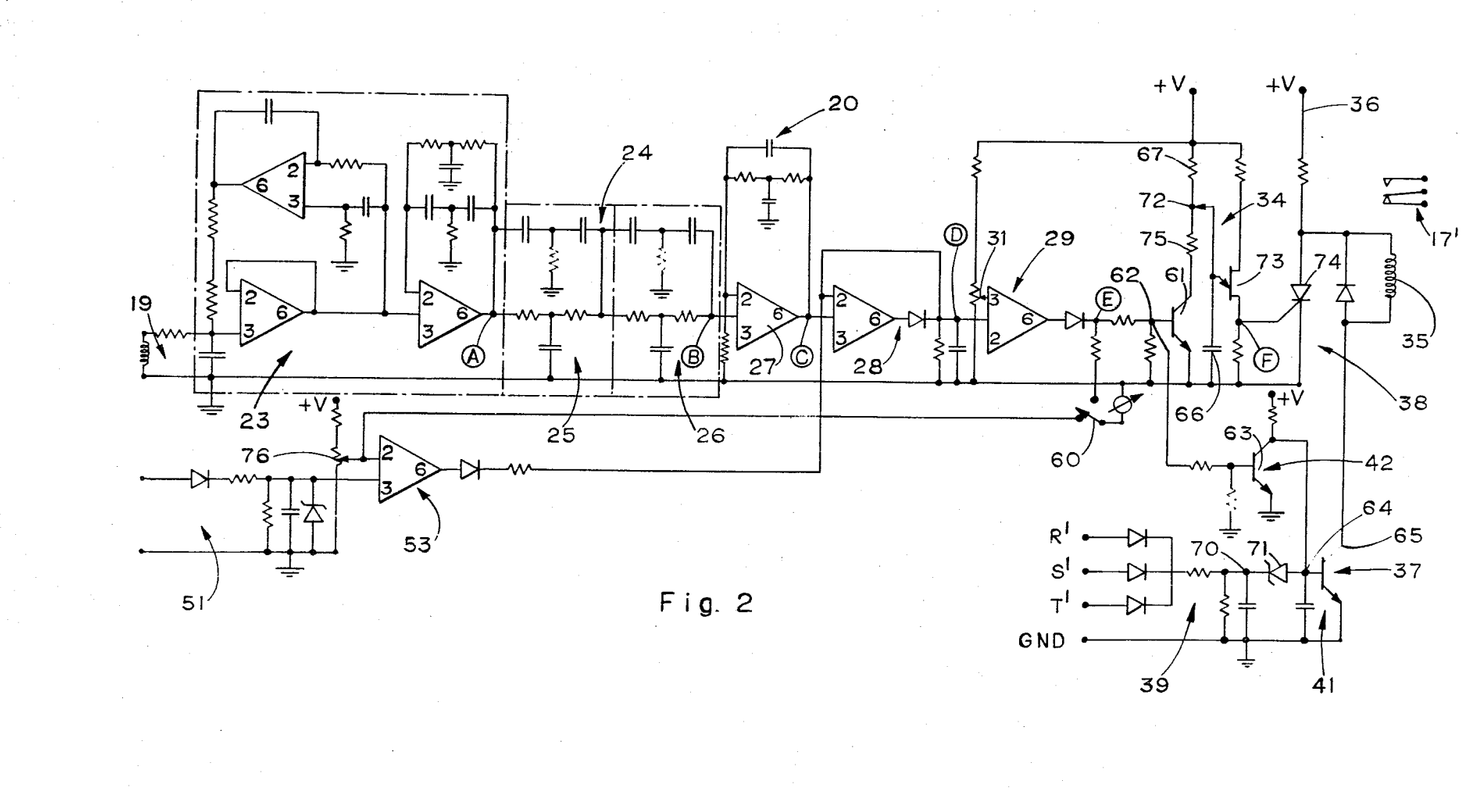
FIG. 2 is an electrical schematic diagram of the invention.

Referring now to FIG. 2 of the drawings, an electrical schematic of the apparatus shown in FIG. 1 is disclosed. To assist in following the circuitry, the nodes specified by A through F shown in FIG. 2 are also marked in FIG. 1.

When rated voltage appears at the terminals R', S' and T' of the circuit 39, the resultant half-wave rectification provides, at node 70, a voltage in excess of the breakdown of Zener diode 71 which thereupon acts as a battery supplying current to the base of transistor 65 constituting the first switch means 37. Transistor 65 is thus in saturation and current flows through the relay coil 35 establishing the first state of contacts 17'. One set of these contacts may be associated with the contactor coil of the motor switch, while the other set may be associated with an alarm or indicator. When current flows through the relay coil 35, the set of contacts associated with the contactor coil of the starter may be closed, while the other set of contacts associated with the alarm may be open.

At this stage, the start input 16 to the starter 15 can be actuated and the motor 11 operated. In the absence of rated voltage at terminals B', S' and T' the voltage level at node 70 will drop below the breakdown voltage of Zener diode 71 with the result that circuit 39 will be unable to sustain transistor 65 in its saturated condition preventing energization of the coil 35.

When the motor is operated in its calibration mode, the setting of potentiometer 31 of comparator 29 can be adjusted to a value in excess of the voltage appearing at node D depending upon the degree of sensitivity desired. The output of the primary comparator at node E under such conditions will have a high level whereby base current is furnished to transistor 61. This transistor will be in saturation holding node 72 at a relatively low voltage and preventing the conduction of uni-junction transistor 73 which constitutes part of the delay generator 34.

Under normal operating conditions, the presence of phase-asymmetry will cause the primary comparator 29 to operate such that the voltage at node D drops to a low level thus cutting off transistor 61 and permitting the voltage at node 72 to rise as capacitor 66 is charged through resistor 67. Charging of this capacitor continues as long as the voltage at node E remains at a sufficiently low level to maintain transistor 61 in its cut-off condition. If transistor 61 remains cut-off for a sufficiently long time, the voltage at node 72 will reach a level sufficiently high with respect to the voltage at node F that uni-junction transistor 73 will conduct. Upon conduction, the charge on capacitor 66 will be dumped into the lower base resistor of uni-junction transistor 73 causing a pulse to appear at node F. Such pulse will fire the silicon controlled rectifier 74 which constitutes the second switch means 38. When SCR 74 conducts, the coil 35 will be shunted by a ground connection and the relay will be de-energized, thus changing the state of contacts 17'. In their changed state, contacts 17' may open the supply to the contactor coil of the motor starter thus shutting down the motor, and close an alarm circuit actuating a visual or aural alarm.

Should phase-asymmetry be transient, or should start duration noise have caused the output at node E to be low, a rise in the voltage at node E before uni-junction transistor 73 begins to conduct will turn-on transistor 61 and discharge capacitor 66 through the collector resistor 75. Thus, spurious triggering of detector 10 is precluded.

During the time that transistor 61 is cut-off, transistor 63, which constitutes the switch operator circuit 42, will also be cut-off by reason of the voltage at node 62. Current will therefore flow through the collector resistor of this transistor to node 64 sustaining base current to transistor 65 and sustaining energization of the relay coil.

Phase-asymmetry may sometimes result in greater than rated voltage appearing in the line and transistor 65 is protected from damage should this occur by reason of Zener diode 71. Finally, switch 60, in its position shown in FIG. 2 provides a monitoring of the reference level at which overload comparator 53 will trip. The setting of potentiometer 76 can thus be changed to establish the desired degree of overload protection.

While sensor 19 is shown in the drawings and described above as comprising a coil containing a soft iron core shunted by a capacitor, this arrangement is not always necessary if sufficient output can be obtained from a coil alone, or from a coil containing a soft iron-core. The coil is preferably a single-layer, cylindrical winding mounted on the motor at either end concentric with the shaft and as close as possible to the housing of the machine, or preferably within the machine housing.

We claim:

1. A detector for detecting phase-asymmetry in connection with a three-phase machine comprising a sensor couplable to the machine for picking up a signal associated with the leakage field during rotation of the machine; circuit means including a bandpass active filter for amplifying characteristic components of the signal (i.e., components whose anplitudes greatly increase relative to other components in the signal when phase-asymmetry occurs) without amplifying other components of the signal, and passive filter means for attenuating other components of the signal, particularly at frequencies around $f$ and $3f$ where $f$ is the line frequency; converter means for converting the output of the circuit means into a control voltage; and control means responsive to increases in the control voltage above a predetermined level established in the absence of phase-asymmetry for producing an output signal indicative of phase-asymmetry.

2. A detector according to claim 1, wherein the sensor comprises a coil adapted to be inductively coupled to the machine.

3. A detector according to claim 2 wherein the coil contains an iron core.

4. A detector according to claim 1 wherein the active element of the circuit means comprises a bandpass active filter for amplifying the sensor signal, the upper and lower cut-off frequencies of the bandpass comprehending the characteristic band of frequencies but excluding the frequencies of $f$ and $3f$ and the circuit means further includes passive filter means for attenuating the output of the bandpass active filter at frequencies outside the upper and lower cut-off frequencies thereof and at least at frequencies including $f$ and $3f$.

5. A detector according to claim 4 wherein the passive filter means includes a first band-rejection filter whose upper and lower cut-off frequencies comprehend the frequency $f$ but exclude the characteristic band of frequencies and a second band-rejection filter whose upper and lower cut-off frequencies comprehend the frequency $3f$ but exclude the characteristic band of frequencies.

6. A detector according to claim 1 wherein the converter means includes a peak detector responsive to the output of the circuit means for producing a DC control voltage whose value is directly related to the peak value of the output of the circuitry means; and the control means includes a primary comparator to whose input is applied the DC control voltage for generating an output signal when the DC control voltage exceeds a reference value; an indicator; and actuating means responsive to an output signal from the primary comparator for actuating the indicator.

7. A detector according to claim 6 wherein the predetermined period of time of the delay generator is selectively adjustable.

8. a detector according to claim 6 wherein the actuating means includes a delay generator responsive to an output signal from the primary comparator persisting for a predetermined period of time for producing an output pulse, the indicator being constructed and arranged to be actuated in response to an output pulse from the delay generator.

9. A detector according to claim 8 wherein the indicator includes a relay having a coil and a set of contacts for causing the power supply to be connected to the terminals of the machine when the coil of the relay is energized; first switch means operable to energize the relay; means for selectively operating the first switch means; second switch means shunting the coil of the relay and operable to de-energize the coil of the relay in response to an output pulse from the delay generator.

10. A detector according to claim 9 wherein the second switch means is a silicon-controlled-rectifier that is fired by an output pulse from the delay generator.

11. A detector according to claim 9 wherein the means for selectively operating the first switch means includes an AC/DC converter connected to the terminals of the machine for producing a DC voltage whose level is directly related to the sum of the voltage in each line connected to the terminals; and a threshold detector for producing an output signal as long as the level of the DC voltage of the AC/DC converter exceeds a predetermined level; the first switch means being constructed and arranged so as to be operable in response to the presence of an output signal from the threshold detector.

12. A detector according to claim 9 wherein the means for selectively operating the first switch means includes a switch operator circuit responsive to the output of the primary comparator for operating the first switch means in the presence of an output signal from the primary comparator.

13. Apparatus using a detector according to claim 9 for protecting a three-phase rotary machine against dangerous operating conditions including a current sensor adapted to be associated with one line of the power supply; converter means for converting the output of the current sensor to a DC voltage whose value is directly related to the magnitude of the current flow in the line associated with the current sensor; an overload comparator for producing a control voltage when the value of the DC voltage of the converter means exceeds a reference value, the magnitude of the last mentioned control voltage exceeding the reference value of the primary comparator; and means to apply the output of the overload comparator to the input of the primary comparator.

14. In combination:
 a. a three-phase rotary machine that produces a leakage field during rotation;
 b. a sensor exposed to said field for producing a signal in response thereto;
 c. circuit means including a bandpass active filter for amplifying characteristic components without amplifying other components of said signal, and passive filter means for attenuating other components; and
 d. means responsive to the output of said circuit means for producing an output signal indicative of phase-asymmetry when the output of said circuit means exceeds a predetermined threshold.

* * * * *

UNITED STATES PATENT AND TRADEMARK OFFICE
CERTIFICATE OF CORRECTION

PATENT NO. : 3,970,897
DATED : July 20, 1976
INVENTOR(S) : David Tamir and Michael S. Erlicki It is certified that error appears in the above-identified patent and that said Letters Patent are hereby corrected as shown below:

Column 1, line 47, "such" should be --Such--;

Column 2, line 21, after "detecting" and before "phase-asymmetry" insert --incipient--;

Column 7, line 6, "shunting" should be --shutting--;

Column 7, line 55, "consequenc" should be --consequence--.

Column 9, line 40, "B'" should be --R'--;

Column 10, line 45, after "three-phase" and before "machine" insert --rotary--; and Column 11, line 4, after "3f" and before "and" insert --,--.

Signed and Sealed this

Ninth Day of November 1976

[SEAL]

Attest:

RUTH C. MASON
Attesting Officer

C. MARSHALL DANN
Commissioner of Patents and Trademarks

UNITED STATES PATENT AND TRADEMARK OFFICE
CERTIFICATE OF CORRECTION

PATENT NO. : 3,970,897
DATED : July 20, 1976
INVENTOR(S) : David Tamir et al

It is certified that error appears in the above—identified patent and that said Letters Patent are hereby corrected as shown below:

Column 11, line 29, change "6" to --8--.

*Signed and Sealed this*

Twenty-fourth *Day of* May 1977

[SEAL]

*Attest:*

RUTH C. MASON
*Attesting Officer*

C. MARSHALL DANN
*Commissioner of Patents and Trademarks*